United States Patent [19]
Slizynski et al.

[11] Patent Number: 6,031,479
[45] Date of Patent: Feb. 29, 2000

[54] PROGRAMMABLE DIGITIZER WITH ADJUSTABLE SAMPLING RATE AND TRIGGERING MODES

[75] Inventors: Roman A. Slizynski; David D. Reynolds, both of Beaverton; Bryan J. Dinteman, Canby; Daniel J. Bedell, Portland, all of Oreg.

[73] Assignee: Credence Systems Corproation, Fremont, Calif.

[21] Appl. No.: 09/066,036

[22] Filed: Apr. 24, 1998

[51] Int. Cl.[7] .............................. H03M 1/12; G06F 13/00
[52] U.S. Cl. ............................................. 341/155; 395/889
[58] Field of Search .................................... 341/155, 123, 341/142, 122; 395/889, 894; 702/71, 66

[56] References Cited

U.S. PATENT DOCUMENTS

| | | | |
|---|---|---|---|
| 4,283,713 | 8/1981 | Phillipp | 341/142 |
| 4,755,951 | 7/1988 | Hollister | 341/122 |
| 4,791,404 | 12/1988 | Hollister | 341/122 |
| 4,799,165 | 1/1989 | Hollister et al. | 702/66 |
| 4,858,142 | 8/1989 | Jenq et al. | 702/71 |
| 4,956,798 | 9/1990 | Dinteman | 708/273 |
| 5,206,944 | 4/1993 | Pilkenton | 341/159 |
| 5,243,343 | 9/1993 | Moriyasu | 341/123 |
| 5,930,735 | 7/1999 | Pun | 702/119 |

*Primary Examiner*—Howard L. Williams
*Assistant Examiner*—Peguy Jean Pierre
*Attorney, Agent, or Firm*—Smith-Hill and Bedell

[57] ABSTRACT

A digitizer can be programmed to digitize an ANALOG signal with a complex frequency pattern determined in response to set of trigger signals. The digitizer includes an addressable packet memory storing a set of data packets and produces one of its stored data packets as output when addressed. The output data packet includes both PERIOD and MODE data fields. The digitizer also incudes an analog-to-digital converter for digitizing the ANALOG signal at the frequency controlled by the PERIOD data output of the packet memory. The MODE data output of the packet memory tells a trigger logic circuit how to choose a next packet memory address and selects one of the trigger signals to tell the trigger logic circuit when to change the packet memory address so as to alter the digitizing frequency.

19 Claims, 3 Drawing Sheets

PROGRAMMABLE DIGITIZER WITH ADJUSTABLE SAMPLING RATE AND TRIGGERING MODES

FIELD OF THE INVENTION

The present invention relates in general to digitizers and in particular to a digitizer that can be programmed to abruptly alter its sampling rate and triggering modes.

DESCRIPTION OF RELATED ART

A typical digitizer periodically samples the magnitude of an analog signal and produces digital output data representing the sample magnitude. The resulting digital data sequence, representing the time-varying behavior of the analog signal, can have many uses. For example a frequency analyzer can process the data sequence to determine the frequency components of the analog signal using well-known methods. However if the digitizer's sampling rate is less than twice the frequency of the highest frequency component of the analog signal, the frequency analyzer will not be able to detect the high frequency components of the analog signal. On the other hand, if the digitizer's sampling rate is higher than twice the highest frequency component of the analog sequence, the data sequence will be longer than the frequency analyzer needs to accurately determine the analog signal's frequency spectrum. Since a longer data sequence requires more processing time and data storage capacity, it is preferable to set the digitizer sampling rate no higher than necessary.

Some analog signals have frequencies that vary over time. For example a signal controlling electron beams scanning the cathode ray tube (CRT) of a color television has a high frequency burst for controlling the color produced by the electron beams when they traverse the CRT, but conveys low frequency synchronizing data between those bursts when the beams are not traversing the CRT. In order to digitize such an analog signal to produce an output data sequence accurately reflecting the nature of the high frequency bursts, we must set the digitizer frequency to a rate that is at least twice the frequency of the high frequency bursts. However if we do so the digitizer will over sample the low frequency portions of the analog signal, thereby generating more data than is necessary to accurately represent the analog signal. It would be helpful if the digitizer could be made to automatically sample each section of the signal at rate that is appropriate to its frequency. It would also be helpful if a digitizer could alter its digitizing rate on-the-fly in response to an input trigger signal.

SUMMARY OF THE INVENTION

The present invention relates to a digitizer that can be programmed to instantly change its sampling rate in accordance with either a set pattern or in response to externally generated trigger signals or both. The digitizer includes an analog-to-digital (A/D) converter for sampling an analog input signal at a rate determined by the frequency of an input CLOCK signal. A clock signal generator produces the CLOCK signal with a period that is controlled by input PERIOD data. The digitizer also includes an acquisition memory clocked by the CLOCK signal that acquires and stores the output data produced by the A/D converter.

In accordance with one aspect of the invention, an addressable packet memory stores a data packet at each of a set of addressable storage locations and produces a stored data packet as output when addressed. The data packet output of the packet memory includes the PERIOD data controlling the clock signal generator frequency and MODE data applied as input to a control logic circuit addressing the memory. The CLOCK signal and an externally generated trigger signal provide additional inputs to the control logic circuit.

In accordance with another aspect of the invention, the MODE data output of the packet memory tells the control logic circuit when and how to alter the address input to the packet memory so as to cause the packet memory to read out new PERIOD data to the clock signal generator. For example the MODE data may tell the logic circuit to count CLOCK signal pulses and to change the packet memory address when the CLOCK signal pulse count reaches a predetermined value or may tell the control logic circuit to alter the memory address when the trigger signal is asserted or de-asserted. The MODE data also tells the control logic circuit whether to alter the memory address by incrementing it or by jumping to a branch or subroutine address.

In accordance with a further aspect of the invention, the control logic circuit also produces CLOCK_EN and ACQ_EN output signals for enabling the clock signal generator and the acquisition memory, respectively. The MODE data output of the packet memory also tells the control logic circuit when to enable and disable the clock signal generator and the acquisition memory. For example the MODE data may tell the control logic circuit to enable or disable the clock signal generator or acquisition memory in response to assertion or de-assertion of the trigger signal or when the CLOCK signal pulse count reaches a predetermined value.

It is accordingly an object of the invention to provide a programmable digitizer that can digitize an input analog signal with a sampling frequency that can changes over time according to a predetermined pattern.

It is another object of the invention that it can digitize an input analog signal with a sampling frequency that can change in response to an input trigger signal.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
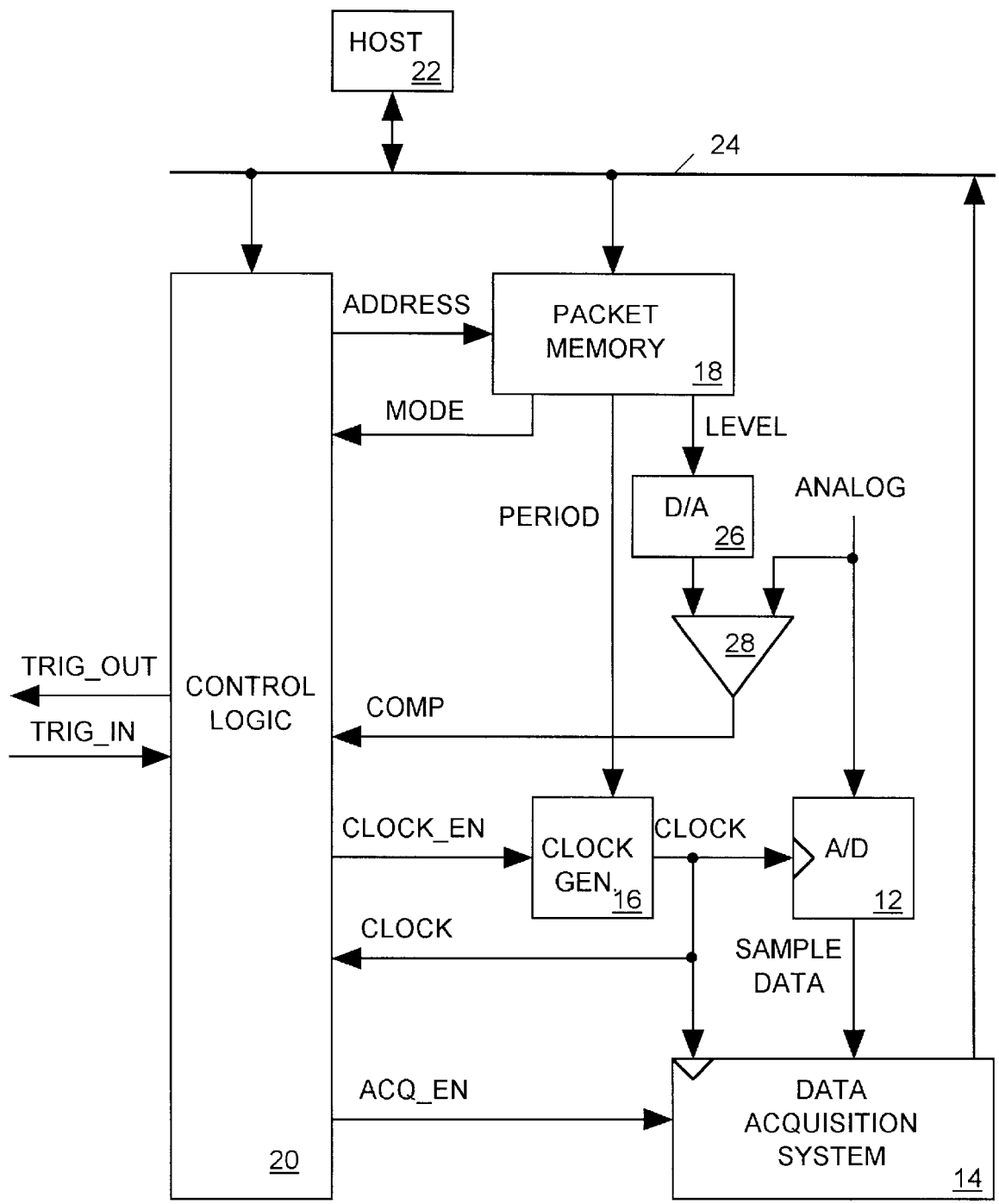
FIG. 1 illustrates a programmable digitizer in accordance with the present invention in block diagram form.

FIG. 1 illustrates in block diagram form a programmable digitizer 10 in accordance with the present invention for digitizing an analog input signal (ANALOG) to produce a data sequence representing the ANALOG signal that it may store in an internal acquisition memory. Digitizer 10 detects several different types of triggering events and can be programmed to respond to any one of those triggering events by carrying out some change in state in its operating mode. Triggering events include a change in state of an externally generated trigger signal (TRIG_IN), acquisition of a predetermined number of ANALOG signal samples, or the ANALOG signal's crossing of a predetermined voltage level. Digitizer 10 can respond to a triggering event by starting or stopping its acquisition of the digitized data sequence, altering its digitizing frequency, and/or changing the state of an output trigger signal (TRIG_OUT).

The operation of digitizer 10 is organized into a succession of time segments with the mode of digitizer operation during each segment being controlled by one of a set of stored data packets. Each data packet includes PERIOD data for controlling the period or frequency of digitization during a segment and MODE data indicating how the digitizer is to respond to triggering events during the segment. One of the stored data packets is selected for controlling the operation of digitizer 10 at the start of a first segment. The MODE data included in the data packet controlling each segment tells the digitizer which data packet is to be selected for controlling the next segment and which triggering event is to initiate the next segment.

As discussed below, a relatively small amount of packet and control data supplied to digitizer 10 can program it to digitize an ANALOG signal in a highly complex pattern and to change that pattern on-the-fly in response to changes in the TRIG_IN signal or in response to the behavior of the ANALOG signal. This makes digitizer 10 useful, for example, as a data input device for a diagnostic tester in which the course of a test can change depending on the behavior of the device being tested. Digitizer 10 is also useful for digitizing an analog signal having high frequency bursts when it is desirable to digitize only the bursts or to digitize the bursts at a higher rate than portions of the analog signal between the bursts or when several bursts have differing time requirements but must be digitized in a single, contiguous acquisition, as in equivalent time digitization.

Digitizer 10 includes a conventional analog-to-digital (A/D) converter 12 for responding to each pulse of a periodic input CLOCK signal by producing output data (SAMPLE DATA) representing the instantaneous amplitude of the ANALOG signal. A conventional acquisition memory system 14, when enabled by an input enable signal (ACQ_EN) responds to successive CLOCK signal pulses by storing successive SAMPLE DATA outputs of A/D converter 12 as successive addresses of an internal random access memory. When enabled by an input enable signal (CLOCK_EN), a programmable clock generator 16 produces the CLOCK signal. An addressable packet memory 18 (suitably a random access memory or an addressable register file) stores a separate data packet at each address, each data packet including both PERIOD and MODE data. When addressed by an address output (ADDRESS) of a control logic circuit 20, packet memory 18 reads out an addressed PERIOD and MODE data. The current PERIOD data output of packet memory 18 is supplied to clock generator 16 and controls the CLOCK signal period.

Each data packet read out of packet memory 18 also includes LEVEL data applied as input to a digital-to-analog (D/A) converter 26. D/A converter 26 converts the level data to an analog signal applied as input to a comparator 28. Comparator 28 produces and output COMP signal when the magnitude of the ANALOG signal rises above that of the output signal of D/A converter 26.

The MODE data output of packet memory 18, the CLOCK signal, the SAMPLE DATA, the COMP signal, and an externally generated trigger signal TRIG_IN all provide inputs to control logic circuit 20. In addition to providing the ADDRESS input to packet memory 18, control logic 20 also supplies the ACQ_EN and CLOCK_EN inputs to clock generator 16 and acquisition memory system 14, respectively, and produces the TRIG_OUT signal. The MODE data input to control logic 20 defines actions control logic 20 carries out in response to state changes in the TRIG_IN or COMP signals or after counting a particular number of CLOCK signal pulses. Possible control logic 20 actions include changing the ADDRESS input to packet memory 18 and asserting or de-asserting the CLOCK_EN, ACQ_EN and TRIG_OUT signals.

A host computer 22 programs digitizer 10 by writing a "data packet" into packet memory 18 and by writing control data into addressable registers within control logic 20 via a conventional computer bus 24. Host computer 22 also reads acquired SAMPLE DATA out of acquisition memory 14 via bus 24 and uses bus 24 to send a START command to control logic circuit 20 telling it to start the first digitizing segment. Control logic circuit 20 uses bus 24 to send an END command back to host computer 22 to tell it when it has completed the last digitizing segment.

Figure 2:
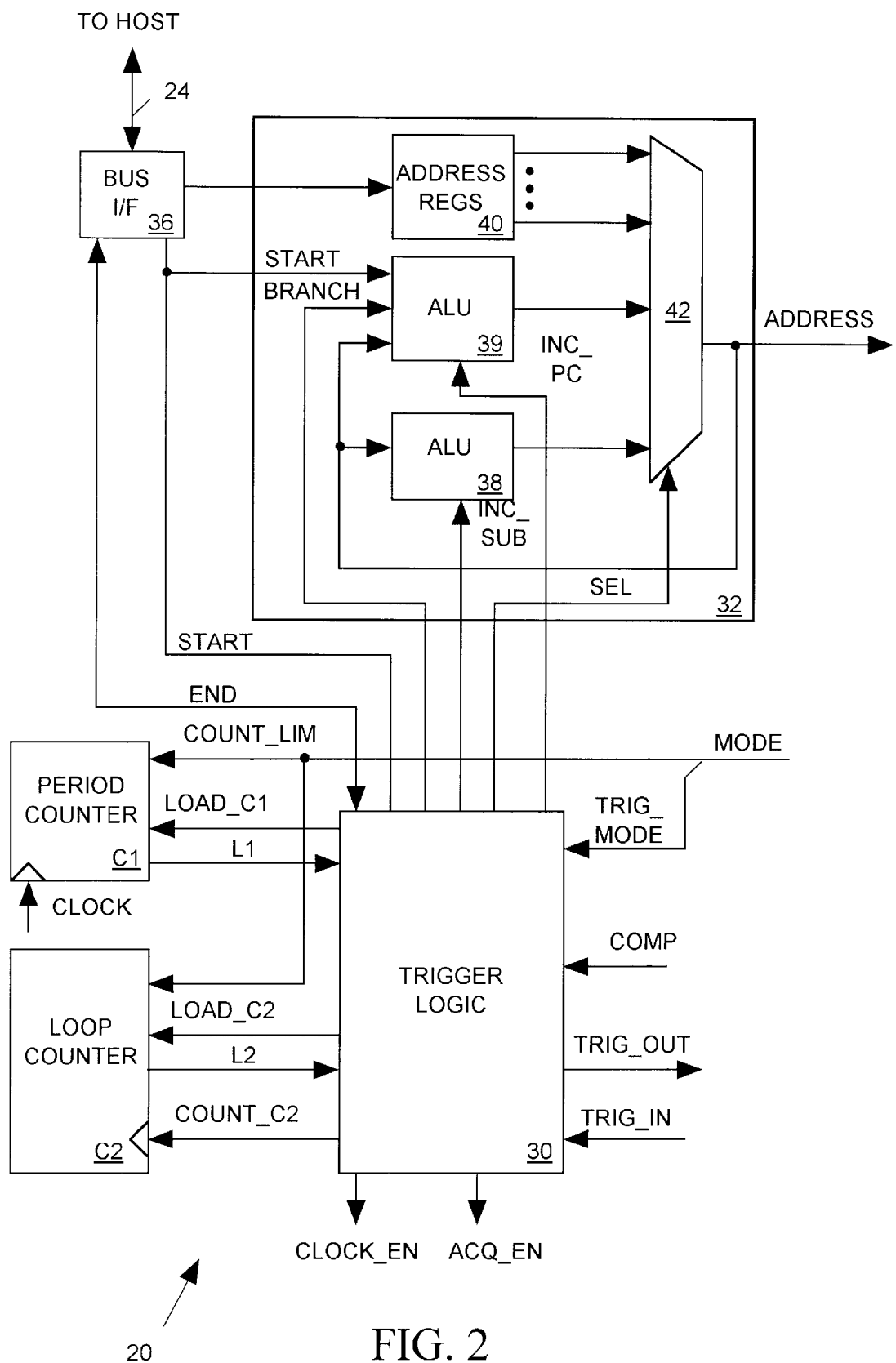
FIG. 2 illustrates control logic circuit 20 of FIG. 1 in more detailed block diagram form.

FIG. 2 illustrates control logic circuit 20 of FIG. 1 in more detailed block diagram form. Control logic circuit 20 includes a trigger logic circuit 30, an address generator circuit 32, a bus interface circuit 36 and a pair of counters C1 and C2. Address generator 32, which provides the ADDRESS input to packet memory 18 of FIG. 1, includes arithmetic logic units (ALU) 38 and 39, a set of six address registers 40, and a multiplexer 42.

Trigger logic circuit 30 tells address generator 32 how and when to change the value of its ADDRESS output. The MODE data input to control logic circuit 20 includes a TRIG_MODE field providing input to a trigger logic circuit 30 and a count limit data (COUNT_LIM) providing input to counters C1 and C2. The TRIG_MODE field defines how trigger logic circuit 30 is to set the state of each of its output signals in response to state changes in its input trigger signals. Those trigger signals include the TRIG_IN and COMP signals, a signal L1 from counter C1, a signal L2 from counter C2, and a START signal from bus interface circuit 36. Trigger logic circuit 30 output signals include the TRIG_OUT signal, the CLOCK_EN and ACQ_EN signals, a LOAD_C1 signal input to counter C1, a LOAD_C2 input to counter C2, a COUNT_C2 signal input to counter C2, a INC_PC signal input to arithmetic logic unit (ALU) 39, an INC_SUB input to an arithmetic logic unit (ALU) 38, control data input (SEL) to multiplexer 42, and an END signal input to a bus interface circuit 36.

Host computer 22 of FIG. 1 communicates with control logic circuit 20 via bus 24 and bus interface circuit 36. To program control logic circuit 20, host computer 22 may load an address into any of the six address registers 40 via bus interface 36. The address content of each register 40, along with the address outputs of ALUs 38 and 39, provide inputs to multiplexer 42. The output ADDRESS of multiplexer 42 is also fed back to inputs of ALUs 38 and 39. Multiplexer 42 responds to the input selection data SEL from trigger logic circuit 30 by delivering one of its inputs as the ADDRESS input to packet memory 18.

The MODE data included in the sequence of data packets stored in packet memory 18 acts as a program for controlling successive changes in the mode of operation of digitizer 10. The program is organized into a main program starting at ADDRESS=0 that can call up to five subroutines. The program may also perform loops and branches, with branches occurring in response to events detected by trigger logic circuit 30. ALU 39 acts as a main program counter providing the packet memory address when digitizer 10 is executing the main program. When the host sends a START command to bus interface circuit 36 to initiate digitizing operations, bus interface circuit 36 sends a START signal to ALU 39 to reset its output address to 0. Trigger logic circuit 30 responds to the START signal by setting multiplexer 42 to select the output of ALU 39, thereby setting the packet memory 18 ADDRESS to zero. This causes packet memory 18 to read out the data packet for the first digitizing segment. Thereafter trigger logic circuit 30 pulses the INC_PC signal to increment the main program address whenever a next digitizing segment of the main program is triggered.

Each of the six address registers 40 can store the starting address of a branch or a subroutine. When the current TRIG_MODE data tells trigger logic circuit 30 to execute a subroutine, trigger logic circuit 30 switches multiplexer 42 to select the output of a particular one of address registers 40. To initiate each digitizing segment thereafter, the TRIG_MODE data tells trigger logic 30 to pulse the INC_SUB signal causing ALU 38 to increment the packet memory ADDRESS output of multiplexer 42. Trigger logic circuit 30 also sets multiplexer 42 to select the output of ALU 38. When the TRIG_MODE data tells trigger logic circuit 30 to return to the main program from a subroutine, trigger logic circuit 30 pulses the INC_PC signal to increment the output of ALU 39, and switches multiplexer 42 so that again selects the output of ALU 39.

When the current TRIG_MODE data tells trigger logic circuit 30 to execute a branch or a loop, trigger logic circuit 30 switches multiplexer 42 to select the output of a particular one of address registers 40. To initiate the next digitizing segment thereafter, the TRIG_MODE data tells trigger logic 30 to pulse a BRANCH signal causing ALU 39 to increment the packet memory ADDRESS output of multiplexer 42. Trigger logic circuit 30 also sets multiplexer 42 to select the output of ALU 39. Thereafter trigger logic circuit 30 resumes pulsing the INC_PC signal to increment the program address.

The MODE data input to control logic circuit 20 also includes a field COUNT_LIM applied as a data input to period counter C1. When trigger logic circuit 30 pulses the LOAD_C1 signal, counter C1 loads the COUNT_LIM data and begins counting down from the value of COUNT_LIM on each pulse of the CLOCK signal. On reaching 0, counter C1 asserts the L1 input to trigger logic circuit 30. The L1 signal can be used, for example, to trigger the start of a new segment after a the ANALOG signal has been sampled the number of times indicated by the COUNT_LIM data loaded into period counter C1.

The COUNT_LIM field of the MODE data is applied as a data input to loop counter C2. When trigger logic circuit 30 pulses the LOAD_C2 signal, counter C2 loads the COUNT_LIM data and begins counting down from the value of COUNT_LIM on each pulse of a COUNT_C2 output of trigger logic circuit 30. On reaching 0, counter C2 asserts an L2 input to trigger logic circuit 30. The C2 counter can be used, for example, to indicate when digitizer has completed a predetermined number of program loops or segment repeats.

The L1, L2, TRIG_IN, and START trigger signal inputs to trigger logic circuit 30 can be used to initiate several triggerable activities during a segment. The TRIG_MODE input to trigger logic circuit 30 indicates the activity, if any, trigger logic circuit 30 is to carry out during a current segment in response to each trigger signal. The triggerable activities the TRIG_MODE data may reference are listed below. The TRIG_MODE data may reference more than one activity concurrently since trigger logic circuit 30 can respond to more than one trigger signal during a segment.

Assert/De-assert TRIG_OUT: The TRIG_OUT signal may be used to inform external circuits of the occurrence of trigger signal events.

Assert/De-assert CLOCK_EN: The CLOCK_EN signal enables or disables clock generator 16 of FIG. 1. When digitizer 10 is to begin digitizing in response to a TRIG_IN pulse, the CLOCK_EN signal can be de-asserted to disable clock generator 16 until triggered by the TRIG_IN pulse.

Assert/De-assert ACQ_EN: The ACQ_EN signal enables or disables data acquisition system 14. The data acquisition system is disabled when the SAMPLE DATA output of A/D converter 12 is not to be saved. This feature allows A/D converter 12 to operate continuously. The alternative would be to gate the clock signal which would introduce jitter into the sample timing.

Pulse LOAD_C1: Trigger logic circuit 30 may pulse the LOAD_C1 signal input to load the COUNT_LIM data into period counter C1. This can be done, for example at the start of a segment when the segment is to continue for a set number of CLOCK signal cycles.

Pulse LOAD_C2: Trigger logic circuit 30 may pulse the LOAD_C2 signal input to load the COUNT_LIM data into loop counter C2. This can be done at the start of the program loop to tell counter C2 how may repetitions of the loop are to be performed.

Pulse COUNT_C2: Trigger logic circuit 30 pulses the COUNT_C2 signal to decrement loop counter C2 when the program reaches the end of each repetition of a loop.

Pulse INC_PC: Trigger logic circuit 30 pulses the INC_PC signal input to increment ALU 39 between main program segments.

Pulse INC_SUB: Trigger logic circuit 30 pulses the INC signal input to ALU 38 to increment the packet address during subroutines.

Pulse END: Trigger logic circuit 30 pulses the END signal input to bus interface circuit 36 to tell host computer 22 that it has halted its digitizing process.

Change SEL: Trigger logic circuit 30 may respond to a trigger event by setting the SEL data to a value indicated by the TRIG_MODE data to select the output of one of registers 40, ALU 38 or ALU 39 as the packet memory address for the next segment.

Figure 3:
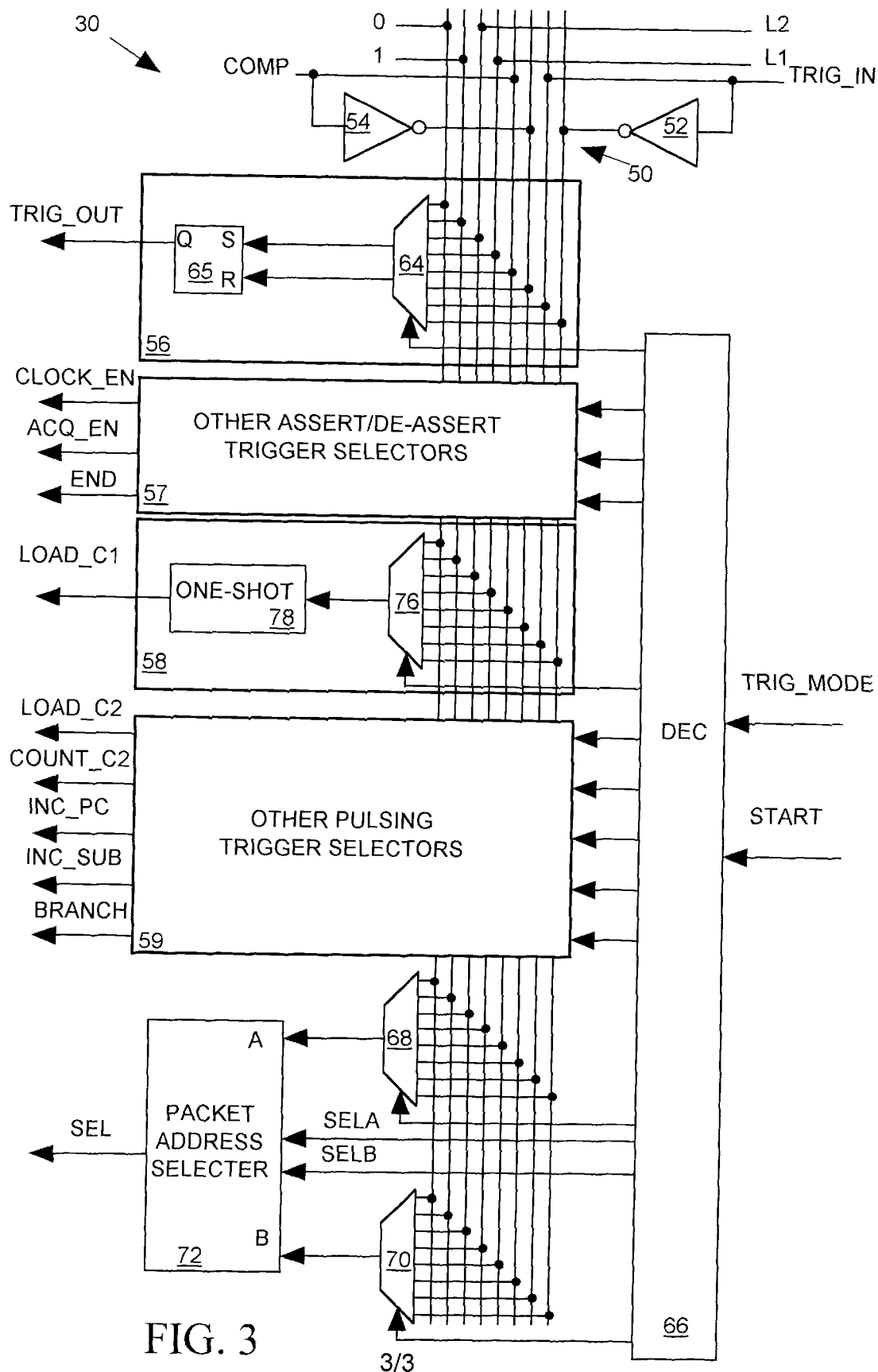
FIG. 3 illustrates trigger logic circuit 30 of FIG. 2 in more detailed block diagram form.

FIG. 3 illustrates trigger logic circuit 30 of FIG. 2 in more detailed block diagram form. Signals L1, L2, TRIG_IN and COMP are each connected to a separate one of bus lines 50. A pair of inverters 52 and 54 invert the TRIG_IN and COMP signals to drive an additional pair of bus lines 50. Two additional bus lines 50 are hard wired to logical 1 and 0 sources. Bus lines 50 are connected in parallel to a set of trigger selectors 56–59 that produce the TRIG_OUT, CLOCK_EN, ACQ_EN, LOAD_C1, LOAD_C2, COUNT_C2, INC_PC, INC_SUB, END and BRANCH signals.

Trigger selector 56 includes a multiplexer 64 and an SR flip-flop 65 producing the TRIG_OUT signal at its Q output. A decoder 66 decodes the incoming TRIG_MODE data to produce a control data input to multiplexer 64 telling it to link one of lines 50 to the flip-flop set input (S) and to connect another of lines 50 to the flip-flop's reset input (R). Thus during the digitizing segment any one of the trigger signals controlling a trigger line 50 can set or reset the TRIG_OUT signal. Other assert/de-assert type trigger selectors 57 similar to trigger selector 56 control the CLOCK_EN, ACQ_EN and END signals.

Trigger selector 58 includes a multiplexer 76 driving a one-shot device 78 producing the LOAD_C1 signal at its output. Decoder 66 decodes the incoming TRIG_MODE data to produce a control data input to multiplexer 76 telling it to link one of trigger lines 50 to one-shot device 78. During the digitizing segment, a rising edge in a trigger signal controlling any selected one of lines 50 tells the one-shot device 78 to pulse the LOAD_C1 signal. A set of six other pulsing type trigger selectors 59 similar to trigger selector 58 control the LOAD_C2, COUNT_C2, INC_PC, INC_SUB, and BRANCH signals.

Trigger logic circuit 30 also includes a pair of multiplexers 68 and 70 controlled by decoder 66. Multiplexer 68 links a selected one of lines 50 to an input A of a packet address selector 72 while multiplexer 70 links a selected one of line 50 to an input B of selector 72. Selector 72 produces the SEL data that controls address selection multiplexer 42 of FIG. 2. When decoding the TRIG_MODE data decoder 66 provides selector 72 with two alternative values (SELA and SELB) that it may supply as the SEL data to address selection multiplexer 42 of FIG. 2 at the start of the next cycle. During the current digitizing cycle, if selector 72 receives a pulse at its A input first, it initiates the next digitizing cycle by forwarding the SELA data as the SEL control input to multiplexer 42 of FIG. 2. Conversely, if it receives a pulse at its B input first, selector 72 forwards the SELB data as the SEL control input to multiplexer 42. This enables digitizer 10 to branch its digitizing activities on-the-fly based on whether various triggering events occur.

The START signal provides an additional input to decoder 66. The host computer sends a START command to bus interface circuit 36 of FIG. 2 to start the digitization process. Bus interface circuit 36 responds by generating a START signal pulse to set the address output of ALU 39 of FIG. 2 to 0. The START signal output of bus interface circuit 36 also provides an additional input to decoder 66. In response to a START signal pulse, decoder 66 tells packet address selector to immediately send out SEL data telling multiplexer 42 of FIG. 2 to provide the starting address output of ALU 39 as the first ADDRESS input to the packet memory 18 of FIG. 1.

Digitizer 10 is particularly useful for digitizing an analog signal having a frequency that varies over time in some predictable manner. For example a signal controlling electron beams scanning the cathode ray tube (CRT) of a color television has a high frequency burst for controlling the color produced by the electron beams when they traverse the CRT, but conveys low frequency synchronizing data between those bursts when the beams are not traversing the CRT. In order to digitize such an analog signal to produce an output data sequence accurately reflecting the nature of the high frequency bursts, we could set a digitizer frequency to a rate that is at least twice the frequency of high frequency bursts. However in such case the digitizer over-samples the low frequency portions of the analog signal, thereby generating more data than is necessary to accurately represent the analog signal. Also, some digital signal processing coherent test procedures require a specific number of samples evenly distributed across the period of a wave segment, since wave segments can vary in length, a digitizing clock period for one wave segment may not be appropriate for the next.

Digitizer 10 permits another approach to digitizing such a signal. Suppose the duration of the high and low frequency portions of the ANALOG signal is fixed and known and that the TRIG_IN signal is synchronized to the first high frequency section to be digitized. To program digitizer 10 host computer 22 can load packets into three packet memory 18 addresses. A packet stored at a first memory address contains MODE data telling control logic 20 to de-assert the ACQ_EN signal so that acquisition memory system 14 does not initially acquire any SAMPLE DATA. The MODE data at the first memory address also tells control logic circuit 20 to increment the ADDRESS input to packet memory 18 when the TRIG_IN signal is asserted.

The alternate SELA and SELB address selection data encoded into the TRIG_MODE data allows digitizer 10 to branch or perform a subroutine depending on which of two trigger signals occurs first during a digitizing segment. This branching capability of digitizer 10 makes it useful, for example, in monitoring an analog output signal of a circuit being tested by an "expert system" diagnostic circuit tester of the type which determines the future course of a test in response to previous results. Digitizer 10 can use the TRIG_OUT signal to communicate detected events to the diagnostic circuit tester in real time and the expert system circuit tester can use the TRIG_IN signal to trigger real time changes in the behavior of digitizer 10 in response to test events detected by other tester components.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A programmable digitizer comprising:

an analog-to-digital (A/D) converter for producing output SAMPLE DATA indicating a magnitude of an input ANALOG signal in response to a pulse of an input CLOCK signal;

a clock signal generator for producing said CLOCK signal with a period controlled by input PERIOD data;

logic means for generating an output ADDRESS of value determined in accordance with input MODE data; and a memory having a plurality of addressable storage locations each storing data packet, said memory being addressed by the output ADDRESS of said logic means and reading out addressed data packet, the read out addressed data packet including said PERIOD data provided as input to said clock signal generator, and said MODE data provided as input to said logic means, wherein said logic means comprises:

address generation means for generating said output ADDRESS in response to input address selection data, and trigger logic means, receiving said MODE data and a plurality of trigger signals, for generating said address selection data in response to said MODE data and in response to an edge of one of said trigger signals referenced by said MODE data.

2. The programmable digitizer in accordance with claim 1 wherein said logic means further comprises a first counter for counting pulses of said CLOCK signal and generating an edge in one of said trigger signals when a number of counted CLOCK signal pulses reaches a first count limit indicated by first count limit data supplied thereto.

3. The programmable digitizer in accordance with claim 2 wherein said logic means further comprises a second counter for counting pulses of an input COUNT signal and generating an edge in another of said trigger signals when it reaches a second count limit indicated by second count limit data supplied thereto, and wherein said trigger logic means also generates a pulse of said COUNT signal in response to one of said trigger signals referenced by said MODE data.

4. The programmable digitizer in accordance with claim 3 wherein a portion of said MODE data is supplied to said first counter and to said second counter, wherein said trigger logic means also generates a first LOAD signal in response to one of said trigger signals referenced by said MODE data, said first LOAD signal causing said first counter to store said portion of said MODE data as said first count limit data, and wherein said trigger logic means also generates a second LOAD signal in response to one of said trigger signals referenced by said MODE data, said second LOAD signal causing said second counter to store said portion of said MODE data as said second count limit data.

5. The programmable digitizer in accordance with claim 3 wherein a portion of said MODE data is supplied to said first counter, and wherein said trigger logic means also generates a first LOAD signal in response to one of said trigger signals referenced by said MODE data, said first LOAD signal causing said first counter to store said portion of said MODE data as said first count limit data.

6. The programmable digitizer in accordance with claim 2 wherein said read out data packet also includes LEVEL data indicating an analog magnitude; and wherein said digitizer further comprises means for receiving said LEVEL data and for generating one of said plurality of trigger signals when said ANALOG signal reaches the analog magnitude indicated by said LEVEL data.

7. The programmable digitizer in accordance with claim 1 wherein said address generation means comprises:

a first arithmetic logic unit (ALU) for computing an output first address, means for producing an output second address, and a multiplexer controlled by said address selection data for selectively delivering one of said first and second addresses as said output ADDRESS of said address generation means in response to said address selection data generated by said trigger logic means.

8. The programmable digitizer in accordance with claim 7 wherein said first ALU increments said first address in response to an input INC_PC signal, and wherein said trigger logic circuit generates said INC_PC signal in response to one of said trigger signals referenced by said MODE data.

9. The programmable digitizer in accordance with claim 8 wherein said first ALU increases a value of said first address by the amount of the ADDRESS output of said multiplexer in response to an input BRANCH signal, and wherein said trigger logic circuit generates said BRANCH signal in response to one of said trigger signals referenced by said MODE data.

10. The programmable digitizer in accordance with claim 7 wherein said means for producing an output second address comprises a second ALU, wherein said second ALU increments a value of the ADDRESS output of said multiplexer to produce said second address in response to an input INC_SUB signal, and wherein said trigger logic circuit generates said INC_SUB signal in response to one of said trigger signals referenced by said MODE data.

11. The programmable digitizer in accordance with claim 10 further comprising a register storing a third address, wherein said multiplexer also selectively delivers said third address as said output ADDRESS of said address generation means in response to said address selection data generated by said trigger logic means.

12. The programmable digitizer in accordance with claim 7 wherein said means for producing an output second address comprises:

a register storing said second address, and means for writing said second address into said register.

13. The programmable digitizer in accordance with claim 1 wherein said clock signal generator produces said CLOCK signal when enabled by an input CLOCK_EN signal, and wherein said trigger logic means generates said CLOCK_EN signal in response to one of said trigger signals referenced by said MODE data.

14. The programmable digitizer in accordance with claim 1 further comprising a data acquisition system for storing said SAMPLE data produced by said A/D converter when enabled by an input ACQ_EN signal, and wherein said trigger logic means generates said ACQ_EN signal in response to one of said trigger signals referenced by said MODE data.

15. The programmable digitizer in accordance with claim 2 wherein said read out addressed data packet also includes LEVEL data indicating an analog magnitude; and wherein said digitizer further comprises means for receiving said LEVEL data and for generating one of said plurality of trigger signals when said ANALOG signal reaches the analog magnitude indicated by said LEVEL data.

16. A method for digitizing an ANALOG signal comprising the steps of:

producing SAMPLE DATA indicating a magnitude of the ANALOG signal in response to a pulse of a CLOCK signal;

producing said CLOCK signal with a period controlled by input PERIOD data;

generating an ADDRESS determined by MODE data; and addressing a memory having a plurality of addressable storage locations each storing a data packet said ADDRESS such that said memory reads out an addressed data packet, the read out data packet including said PERIOD data and said MODE data, wherein said MODE data references at least one of a plurality of trigger signals, and wherein the step of generating said ADDRESS comprises the substeps of:

generating said output ADDRESS in response to input address selection data, and generating said input address selection data in response to said MODE data and in response to an edge of a trigger signal referenced by said MODE data.

17. The method in accordance with claim 16 wherein one trigger signal referenced by said MODE data is produced by counting pulses of said CLOCK signal and generating an edge in said one trigger signal when a number of counted CLOCK signal pulses reaches a predetermined limit.

18. The method in accordance with claim 16 further comprising the steps of counting pulses in a first trigger signal referenced by said MODE data; and generating an edge in a second trigger signal referenced by said MODE data when a number of counted first trigger pulses reaches a predetermined count limit.

19. The method in accordance with claim 16 wherein said read out data packet also includes LEVEL data indicating an analog magnitude and further comprising the step of generating one of said plurality of trigger signals referenced by said MODE data when said ANALOG signal reaches the analog magnitude indicated by said LEVEL data.

* * * * *

UNITED STATES PATENT AND TRADEMARK OFFICE
CERTIFICATE OF CORRECTION

PATENT NO. : 6,031,479
DATED : February 29, 2000
INVENTOR(S) :   Roman A. Slizynski
                David D. Reynolds
                Bryan J. Dinteman
                Daniel J. Bedell It is certified that error appears in the above-identified patent and that said Letters Patent is hereby corrected as shown below:

Column 9, line 26 (claim 5, line 2), "3" should be deleted and replaced with --2--.

Column 10, line 38 (claim 15, line 2), "2" should be deleted and replaced with --1--.

Signed and Sealed this

Fifth Day of December, 2000

*Attest:*

Q. TODD DICKINSON

*Attesting Officer*           *Director of Patents and Trademarks*